United States Patent
Tan et al.

(10) Patent No.: US 12,156,377 B2
(45) Date of Patent: Nov. 26, 2024

(54) IMMERSION COOLING SYSTEM

(71) Applicant: Delta Electronics, Inc., Taoyuan (TW)

(72) Inventors: Li-Kuang Tan, Taoyuan (TW); Sung Tsang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 141 days.

(21) Appl. No.: 17/476,267

(22) Filed: Sep. 15, 2021

(65) Prior Publication Data
US 2022/0338376 A1    Oct. 20, 2022

(30) Foreign Application Priority Data

Apr. 14, 2021   (CN) .......................... 202110400256.1

(51) Int. Cl.
*H05K 7/20*     (2006.01)

(52) U.S. Cl.
CPC ......... *H05K 7/20327* (2013.01); *H05K 7/203* (2013.01); *H05K 7/20318* (2013.01); *H05K 7/208* (2013.01)

(58) Field of Classification Search
CPC . H05K 7/20327; H05K 7/203; H05K 7/20318
See application file for complete search history.

(56) References Cited

U.S. PATENT DOCUMENTS

| | | | | |
|---|---|---|---|---|
| 5,119,021 A | * | 6/1992 | Taraci | ............... G05D 23/01 165/80.4 |
| 8,616,398 B2 | | 12/2013 | Riordan | |
| 2007/0193721 A1 | * | 8/2007 | Tilton | ............... F25B 43/04 165/104.19 |
| 2013/0139998 A1 | * | 6/2013 | Hayashi | ............... H01L 23/473 165/47 |
| 2018/0016094 A1 | | 1/2018 | Tschatschula et al. | |
| 2019/0014685 A1 | * | 1/2019 | So | ............... H05K 7/20272 |
| 2019/0297747 A1 | * | 9/2019 | Wakino | ............... H01L 23/427 |
| 2019/0383559 A1 | * | 12/2019 | Aoki | ............... F28D 1/05316 |
| 2022/0264768 A1 | * | 8/2022 | Horng | ............... H05K 7/20327 |

FOREIGN PATENT DOCUMENTS

| | | |
|---|---|---|
| CN | 207046135 U | 2/2018 |
| CN | 208412806 U | 1/2019 |

* cited by examiner

*Primary Examiner* — David J Teitelbaum
(74) *Attorney, Agent, or Firm* — KIRTON McCONKIE; Evan R. Witt

(57) ABSTRACT

The disclosure relates to an immersion cooling system including a tank, an access opening, a first dielectric liquid, a working object and a condensing unit. The tank has a space and a cover. The cover is detachably disposed on the tank to close or open the space selectively. The access opening is in communication with the space of the tank. The first dielectric liquid is accommodated within the space to form a liquid surface. The liquid surface and the access opening are disposed adjacent to each other. The working object is immersed in the first dielectric liquid. The condensing unit is arranged in the space above the liquid surface. When a cooling operation is performed, the access opening is closed, the first dielectric liquid is kept in the space, and the heat generated from the working object is dissipated through the first dielectric liquid and the condensing unit.

10 Claims, 4 Drawing Sheets

IMMERSION COOLING SYSTEM

FIELD OF THE INVENTION

The present disclosure relates to a cooling system, and more particularly to an immersion cooling system for avoiding the loss of volatile dielectric liquid during system maintenance and ensuring the stability of cooling performance.

BACKGROUND OF THE INVENTION

An immersion cooling system is a cooling system, in which the electronic equipment is immersed in a thermally conductive dielectric liquid or refrigerant to achieve the effect of heat dissipation. The thermally conductive dielectric liquid directly contacts the heat-generating electronic components in the electronic equipment, and the heat is removed from the system through the cold heat exchanger. Therefore, the thermally conductive dielectric liquid suitable for the immersion cooling system must have very good insulating properties to ensure that the thermally conductive dielectric liquid can contact the heat-generating electronic components safely.

On the other hand, the thermally conductive dielectric liquid used in the immersion cooling system is more involved in phase change and has the characteristic of being volatile. Therefore, the thermally conductive dielectric liquid is significantly lost due to the evaporation during the maintenance process of the immersion cooling system with the cover opened. Since the thermally conductive dielectric liquid is expensive and used in the immersion cooling system, the significant loss of the thermally conductive dielectric liquid may affect the cooling performance of the overall system and the cost is increased.

Therefore, there is a need of providing an immersion cooling system for avoiding the loss of volatile dielectric liquid during system maintenance and ensuring the stability of cooling performance, so as to overcome the above drawbacks.

SUMMARY OF THE INVENTION

An object of the present disclosure is to provide an immersion cooling system to avoid the loss of dielectric liquid when the working object immersed therein is repaired or replaced.

According to an aspect of the present disclosure, an immersion cooling system is provided. The immersion cooling system includes a tank, a first dielectric liquid and an access opening. The tank has a space. The first dielectric liquid is accommodated within the space to form a liquid surface. The access opening is in communication with the space above the liquid surface and disposed adjacent to the liquid surface of the first dielectric liquid. When a cooling operation is performed in the immersion cooling system, the access opening is closed, so that the first dielectric liquid is kept in the space and the access opening is connected to the liquid surface of the first dielectric liquid.

According to another aspect of the present disclosure, an immersion cooling system is provided. The immersion cooling system includes a tank, a first dielectric liquid, a second dielectric liquid and a communication object. The tank has a space. The first dielectric liquid is accommodated within the space. The second dielectric liquid covers a liquid surface of the first dielectric liquid. The communication object is accommodated within the space. The communication object allows a part of the liquid surface of the first dielectric liquid uncovered through the second dielectric liquid or covered by the second dielectric liquid.

According to a further aspect of the present disclosure, an immersion cooling system is provided. The immersion cooling system includes a tank, a first dielectric liquid, a second dielectric liquid and a communication object. The tank has a space. The first dielectric liquid is accommodated within the space. The second dielectric liquid is arranged above the first dielectric liquid and contacted with the first dielectric liquid. The communication object is accommodated within the space. The communication object allows a part of the liquid surface of the first dielectric liquid exposed or not exposed to the space free of being filled with the first dielectric liquid and the second dielectric liquid.

The above objects and advantages of the present disclosure become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only; it is not intended to be exhaustive or to be limited to the precise form disclosed.

Figure 1:
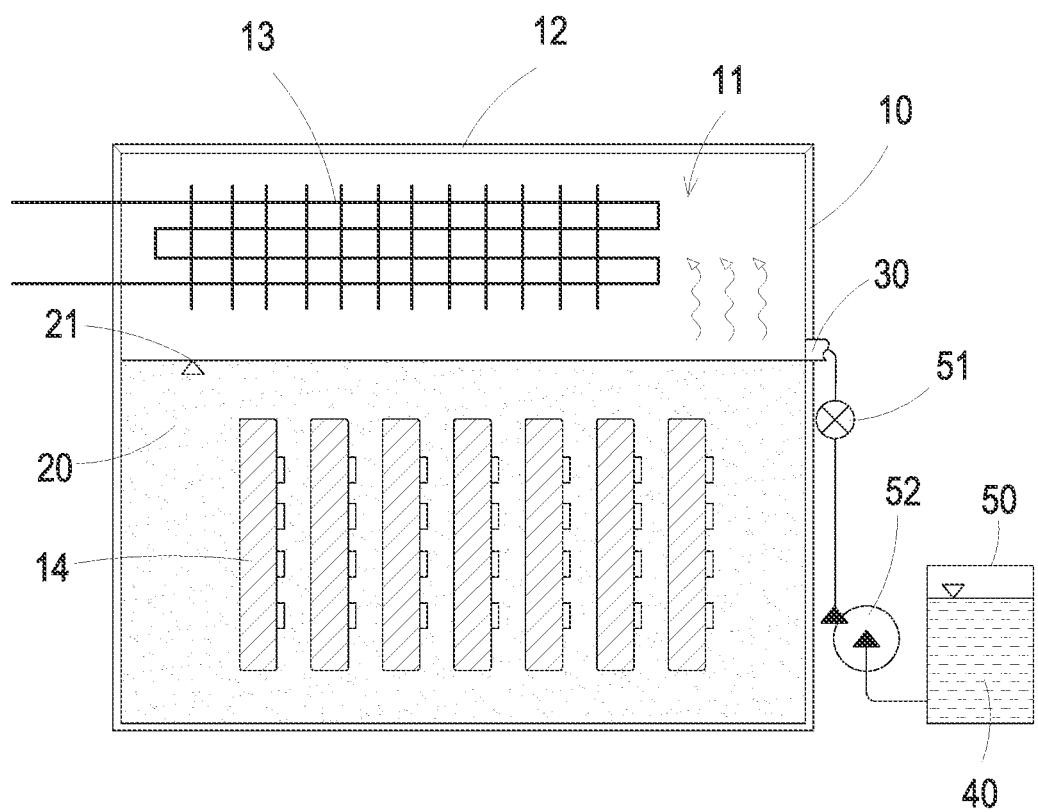
FIG. 1 is a schematic diagram illustrating an immersion cooling system according to a first embodiment of the present disclosure.
Figure 2:
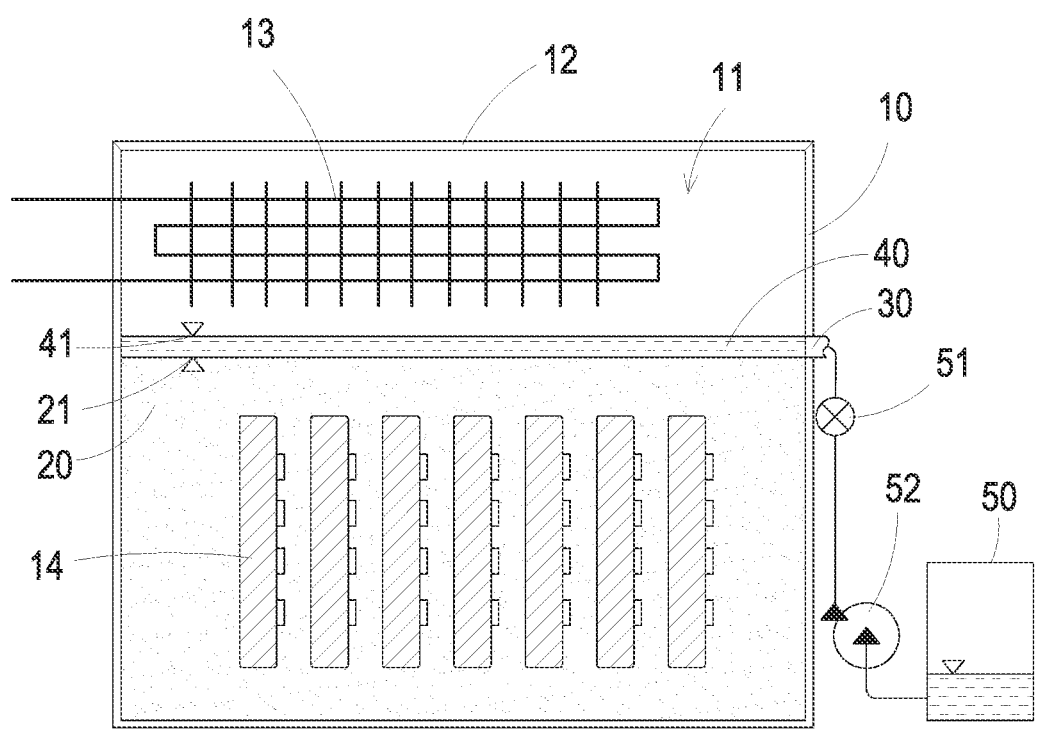
FIG. 2 is a schematic diagram showing the immersion cooling system with the second dielectric liquid introduced into the space of the tank according to the first embodiment of the present disclosure.

FIG. 1 is a schematic diagram illustrating an immersion cooling system according to a first embodiment of the present disclosure. FIG. 2 is a schematic diagram showing the immersion cooling system with the second dielectric liquid introduced into the space of the tank according to the first embodiment of the present disclosure. In the embodiment, preferably but not exclusively, the immersion cooling system 1 is applied to the cooling of the servers. Certainly, the present disclosure is not limited thereto. In the embodiment, the immersion cooling system 1 includes a tank 10, a first dielectric liquid 20 and an access opening 30. The tank 10 has a space 11. The first dielectric liquid 20 is accommodated within the space 11 to form a liquid surface 21. The access opening 30 spatially corresponds to the liquid surface 21 of the first dielectric liquid 20. The access opening 30 is in communication with the space 11 of the tank 10 above the liquid surface 21 and disposed adjacent to the liquid surface 21 of the first dielectric liquid 20. When a cooling operation is performed, the access opening 30 is closed, so that the first dielectric liquid 20 is kept in the space 11. Moreover, the access opening 30 and the liquid surface 21 of the first dielectric liquid 20 are coplanar and connected with each other. Whereby, the height of the liquid surface 21 of the first dielectric liquid 20 is effectively controlled in the immersion cooling system 1, and the stability of the overall cooling performance is maintained. In the embodiment, the tank 10 further includes a cover 12 detachably disposed on the tank 10, so as to open the space 11 for maintenance of the immersion cooling system 1 or initial installation of the immersion cooling system 1. In the embodiment, the access opening 30 is adjacently connected to the liquid surface 21. Preferably but not exclusively, a bottom edge of the access opening 30 is slightly higher than the liquid surface 21, lower than the liquid surface 21 or aligned to the liquid surface 21. When the access opening 30 is lower than the liquid surface 21, a partial closure/opening or a full closure/opening method is utilized for transporting or discharging a second dielectric liquid 40. In the embodiment, the access opening 30 is not only utilized for transporting or discharging the second dielectric liquid 40, but also for transporting or discharging the first dielectric liquid 20. In an embodiment, a part of the first dielectric liquid 20 is discharged out of the space 11 firstly through the access opening 30, and then the second dielectric liquid 40 is discharged out of the space 11 through the access opening 30. Thereafter, the first dielectric liquid 20 is transported through the access opening 30 and flows back to the space 11.

In the embodiment, the first dielectric liquid 20 is a thermally conductive dielectric liquid, such as 3M Fluorinert Electronic Liquids. The first dielectric liquid 20 has a density pi ranged from 1.68 g/cm³ to 1.86 g/cm³, and a vapor pressure $P_1$ ranged from 0.29 kPa to 35 kPa. Moreover, the first dielectric liquid 20 is volatile, and has a thermal conductivity coefficient ranged from 0.057 W/mK to 0.066 W/mK, and a dielectric constant ranged from 1.8 (@ 1 kHz) to 1.9 (@ 1 kHz). In the embodiment, the immersion cooling system 1 further includes a condensing unit 13 and a working object 14. Preferably but not exclusively, the working object 14 is a heat-generating electronic component in an electronic device, and is immersed in the first dielectric liquid 20. The working object 14 is in direct contact with the first dielectric liquid 20, and the heat generated from the working object 14 is dissipated through the first dielectric liquid 20. In the embodiment, the first dielectric liquid 20 is evaporated into the space 11 by absorbing the heat generated from the working object 14. In the embodiment, the condensing unit 13 is disposed in the space 11 of the tank 10 and arranged above the liquid surface 21 of the first dielectric liquid 20. When the first dielectric liquid 20 is evaporated into the closed space 11 due to the heat generated from the working object 14, the vaporized first dielectric liquid 20 is condensed through the condensing unit 13 and dropped to the liquid surface 21 of the first dielectric liquid 20, so that the stability of the overall cooling performance is maintained.

In the embodiment, when the first dielectric liquid 20 is accommodated within the space 11, the space 11 of the tank 10 is kept closed to perform the cooling operation. Moreover, the access opening 30 is closed when the cooling operation is performed in the immersion cooling system 1, so as to ensure that the space 11 is isolated and closed. After the cooling operation is performed through the first dielectric liquid 20, the temperature of the first dielectric liquid 20 is increased and the volatility of the first dielectric liquid 20 is increased. In the embodiment, since the access opening 30 is connected to the liquid surface 21 of the first dielectric liquid 20, a second dielectric liquid 40 is introduced into the space 11 of the tank 10 through the access opening 30. When the second dielectric liquid 40 is introduced into the space 11, the second dielectric liquid 40 covers the liquid surface 21 of the first dielectric liquid 20. Preferably but not exclusively, the liquid surface 41 of the second dielectric liquid 40 is also connected to the access opening 30. In the embodiment, preferably but not exclusively, the second dielectric liquid 40 is silicon oil, which has a density $\rho_2$ of 0.93 g/cm3, and a vapor pressure $P_2$ of 0.13 kPa. Notably, with the characteristics of the first dielectric liquid 20 and the second dielectric liquid 40, the first dielectric liquid 20 is immiscible with the second dielectric liquid 40. Moreover, the density $\rho_2$ of the second dielectric liquid 40 is less than the density $\rho_1$ of the first dielectric liquid 20, and the vapor pressure $P_2$ of the second dielectric liquid 40 is less than the vapor pressure $P_1$ of the first dielectric liquid 20. In the embodiment, preferably but not exclusively, the liquid surface 21 of the first dielectric liquid 20 and the liquid surface 41 of the second dielectric liquid 40 are controlled at a low level and a high level, respectively, through the access opening 30. In an embodiment, the height difference between the liquid surface 21 of the first dielectric liquid 20 and the liquid surface 41 of the second dielectric liquid 40 is controlled for example by the diameter of the access opening 30. Certainly, the present disclosure is not limited thereto. In the embodiment, the tank 10 of the immersion cooling system 1 further includes the cover 12 detachably disposed on the tank 10 for selectively closing or opening the space 11. Preferably but not exclusively, the second dielectric liquid 40 of the immersion cooling system 1 is introduced to cover the first dielectric liquid 20 before the closed system is opened. It is helpful of avoiding the volatilization and the loss of the first dielectric liquid 20 and ensuring the stability of the cooling performance of the entire immersion cooling system 1.

In the embodiment, the first dielectric liquid 20 is immiscible with the second dielectric liquid 40, the density $\rho_2$ of the second dielectric liquid 40 is less than the density $\rho_1$ of the first dielectric liquid 20, and the vapor pressure $P_2$ of the second dielectric liquid 40 is less than the vapor pressure $P_1$ of the first dielectric liquid 20. By utilizing the characteristics of the first dielectric liquid 20 and the second dielectric liquid 40, after the cover 12 of the immersion cooling system 1 is opened, the second dielectric liquid 40 covers the first dielectric liquid 20, and it is still helpful of avoiding the volatilization and the loss of the first dielectric liquid 20.

On the other hand, the first dielectric liquid 20 is served as a heat-dissipation medium for the working object 14, and the temperature of the first dielectric liquid 20 is increased as the heat generated from the working object 14 is absorbed by the first dielectric liquid 20. In the embodiment, with the liquid surface 21 of the first dielectric liquid 20 covered by the second dielectric liquid 40, even if the first dielectric liquid 20 is kept in a high temperature state, the first dielectric liquid 20 still cannot be volatilized away through the second dielectric liquid 40. At this time, if the operator wants to maintain or replace the working object 14 immersed in the first dielectric liquid 20, the working object 14 can be directly taken out or replaced by the operator through the second dielectric liquid 40. There is no need to wait for the first dielectric liquid 20 to cool down before performing the maintenance or replacement operation. Thus, the operation time of maintaining or replacing the working object 14 is reduced. At the same time, it ensures that the first dielectric liquid 20 does not volatilize and lose during performing the maintenance or replacement operation. After the maintenance or replacement operation is completed, the cover 12 is closed, and the space 11 of the tank 10 is closed. Thereafter, the second dielectric liquid 40 is discharged out of the liquid surface 21 of the first dielectric liquid 20. In that, the liquid surface 21 of the first dielectric liquid 20 is uncovered and exposed to the closed space 11 of the tank 10, and the heat generated from the working object 14 is dissipated effectively, as shown in FIG. 1. In other words, with the liquid surface 21 of the first dielectric liquid 20 selectively covered by the second dielectric liquid 40, the maintenance or replacement operation of the working object 14 immersed in the first dielectric liquid 20 is simplified. Moreover, the work time is decreased and the operation efficiency is improved. In other embodiments, the working object 14 is immersed in the first dielectric liquid 20 through the second dielectric liquid 40 in an initial installation. It is not redundantly described herein.

In the embodiment, the immersion cooling system 1 further includes a liquid storage tank 50, a control device 51 and a pump 52. The liquid storage tank 50 is in fluid communication with the space 11 of the tank 10 through the access opening 30 for storing the second dielectric liquid 40. The control device 51 and the pump 52 are arranged between the access opening 30 and the liquid storage tank 50. The control device 51 is configured to make the liquid storage tank 50 in fluid communication with the space 11 or not. When the cooling operation is performed in the immersion cooling system 1, the access opening 30 is closed by the control device 51 and not in fluid communication with the outside, so that the space 11 of the tank 10 is kept isolated and closed. When the cooling operation of the immersion cooling system 1 is stopped to perform the maintenance or replacement operation of the working object 14, the access opening 30 is opened by the control device 51 and in fluid communication between the liquid storage tank 50 and the space 11 of the tank 10. Furthermore, the second dielectric liquid 40 stored in the liquid storage tank 50 is pumped by the pump 52 and transported to the space 11 of the tank 10 through the access opening 30. In the embodiment, the first dielectric liquid 20 is immiscible with the second dielectric liquid 40, the density $\rho_2$ of the second dielectric liquid 40 is less than the density $\rho_1$ of the first dielectric liquid 20, and the vapor pressure $P_2$ of the second dielectric liquid 40 is less than the vapor pressure $P_1$ of the first dielectric liquid 20. With the characteristics of the first dielectric liquid 20 and the second dielectric liquid 40, when the second dielectric liquid 40 is transported into the space 11 of the tank 10, the liquid surface 21 of the first dielectric liquid 20 is covered by the second dielectric liquid 40, so that the volatilization and the loss of the first dielectric liquid 20 is avoided. With the control of the control device 51 and the transportation of the pump 52, the height of the liquid surface 41 of the second dielectric liquid 40 is adjustable according to the practical requirements. The present disclosure is not limited thereto. Moreover, after the liquid surface 21 of the first dielectric liquid 20 is covered by the second dielectric liquid 40, the access opening 30 is closed by the control device 51 and not in fluid communication with the liquid storage tank 50, and the operation of the pump 52 is stopped at the same time. Certainly, the present disclosure is not limited thereto.

Based on the immersion cooling system 1 of the present disclosure, an operating method of an immersion cooling system is provided. Firstly, a tank 10 and an access opening 30 connected to each other are provided according to the operation method of the present disclosure. In the embodiment, the tank 10 includes a space 11 and a cover 12. The access opening 30 is in fluid communication with the space 11 of the tank 10. The cover 12 is detachably disposed on the top of the tank 10 for selectively closing or opening the space 11. In addition, a condensing unit 13 is accommodated within the space 11 of the tank 10, and the position of the condensing unit 13 is higher than the height level of the access opening 30. Then, a first dielectric liquid 20 is transported into the space 11 through the access opening 30, and a liquid surface 21 is formed. Preferably but not exclusively, the liquid surface 21 of the first dielectric liquid 20 is aligned to the height level of the access opening 30. In other words, in the embodiment, the access opening 30 spatially corresponds to the liquid surface 21 of the first dielectric liquid 20, and the liquid surface 21 of the first dielectric liquid 20 is disposed adjacent to the access opening 30. Notably, the cooling operation is not started in the process of introducing the first dielectric liquid 20. Therefore, the initial temperature of the first dielectric liquid 20 is low, and it is not easy to vaporize the first dielectric liquid 20. At this time, the cover 12 of the tank 10 is opened to expose the first dielectric liquid 20 to the space 11, and the operator can immerse the working object 14 in the first dielectric liquid 20. After the initial installation of the working object 14 is completed, the cover 12 is closed to isolate the space 11 of the tank 10, so that the heat generated from the working object 14 is dissipated through the first dielectric liquid 20. In addition, the access opening 30 is closed when a cooling operation is performed in the immersion cooling system 1, so that the first dielectric liquid 20 is kept in the space 11.

Certainly, in order to ensure that the volatilization and the loss of the first dielectric liquid 20 is avoided during the initial installation of the working object 14, before the space 11 is opened through the cover 12, the access opening 30 is opened by the control of the control device 51 and in fluid communication between the space 11 and the liquid storage tank 50, and the second dielectric liquid 40 stored in the liquid storage tank 50 is pumped by the pump 52 and transported into the space 11 of the tank 10 through the access opening 30. When the liquid surface 21 of the first dielectric liquid 20 is completely covered by the second dielectric liquid 40, the control device 51 and the pump 52 are shut down. Thereafter, the space 11 of the tank 10 is opened through the cover 12, and the liquid surface 41 of the second dielectric liquid 40 is exposed to the opened space 11. Since the first dielectric liquid 20 is covered by the second dielectric liquid 40, the volatilization and the loss of the first dielectric liquid 20 is avoided. At this time, the initial installation of the working object 14 is performed. The working object 14 is immersed in the first dielectric liquid 20 by the operator. After the initial installation of the working object 14 is completed, the cover 12 is closed to isolate the space 11 of the tank 10. Thereafter, the access opening 30 is opened by the control device 51 and in fluid communication between the space 11 and the liquid storage tank 50, the second dielectric liquid 40 covering the liquid surface 21 of the first dielectric liquid 20 is pumped out by the pump 52 and transported into the liquid storage tank 50 for storage through the access opening 30. After the second dielectric liquid 40 is discharged out of the space 11, the access opening 30 is closed by the control device 51 and not in fluid communication between the space 11 and the liquid storage tank 50, and the operation of the pump 52 is stopped. In that, the liquid surface 21 of the first dielectric liquid 20 is uncovered and exposed to the closed space 11 of the tank 10, and the heat generated from the working object 14 is dissipated through the first dielectric liquid 20 effectively. In an embodiment, the control device 51 and the access opening 30 are detachably connected to each other. After the initial installation is completed, the control device 51 is detached from the access opening 30, and the access opening 30 is closed to isolate the space 11 of the tank 10. The present disclosure is not limited thereto.

Notably, when the working object 14 is immersed in the first dielectric liquid 20, the first dielectric liquid 20 is served as a heat-dissipation medium for the working object 14. The first dielectric liquid 20 is cooperated with the condensing unit 13 in the closed space 11 to provide cooling function for the working object 14 immersed therein. During the cooling operation, the temperature of the first dielectric liquid 20 directly in contact with the working object 14 is gradually increased. If the closed space 11 is opened at this time, a large amount of the first dielectric liquid 20 is escaped and lost.

Therefore, in order to perform the maintenance or replacement operation of the work object 14 in the immersion cooling system 1 of the present disclosure, the access opening 30 is opened by the control device 51 firstly, and the second dielectric liquid 40 stored in the liquid storage tank 50 is pumped by the pump 52 and transported into the space 11 of the tank 10 through the access opening 30. When the liquid surface 21 of the first dielectric liquid 20 is completely covered by the second dielectric liquid 40, the control device 51 and the pump 52 are shut down. Thereafter, the space 11 of the tank 10 is opened through the cover 12, and the liquid surface 41 of the second dielectric liquid 40 is exposed to the opened space 11. Since the first dielectric liquid 20 is covered by the second dielectric liquid 40, the volatilization and the loss of the first dielectric liquid 20 is avoided. At this time, the maintenance or replacement operation of the working object 14 is performed.

Moreover, with the liquid surface 21 of the first dielectric liquid 20 covered by the second dielectric liquid 40 during performing the maintenance or replacement operation, even if the first dielectric liquid 20 is kept in a high temperature state, the first dielectric liquid 20 still cannot be volatilized away through the second dielectric liquid 40. The working object 14 can be directly taken out or replaced by the operator through the second dielectric liquid 40. After the maintenance or replacement operation is completed, the working object 14 is immersed in the first dielectric liquid 20 through the second dielectric liquid 40, and the working object 14 is in direct contact with the first dielectric liquid 20. In the embodiment, the first dielectric liquid 20 is immiscible with the second dielectric liquid 40, the density $\rho_2$ of the second dielectric liquid 40 is less than the density $\rho_1$ of the first dielectric liquid 20, and the vapor pressure $P_2$ of the second dielectric liquid 40 is less than the vapor pressure $P_1$ of the first dielectric liquid 20. With the characteristics of the first dielectric liquid 20 and the second dielectric liquid 40, when the working object 14 is passed through the second dielectric liquid 40 and immersed into the first dielectric liquid 20, the liquid surface 21 of the first dielectric liquid is covered by the second dielectric liquid 40, and it ensures that the volatilization and the loss of the first dielectric liquid 20 is avoided.

In the embodiment, after the maintenance or replacement operation of the working object 14 is completed, the cover 12 is closed to isolate the space 11 of the tank 10. Thereafter, the access opening 30 is opened by the control device 51 and in fluid communication between the space 11 and the liquid storage tank 50, the second dielectric liquid 40 covering the liquid surface 21 of the first dielectric liquid 20 is pumped out by the pump 52 and transported into the liquid storage tank 50 for storage through the access opening 30. After the second dielectric liquid 40 is discharged out of the space 11, the access opening 30 is closed by the control device 51 and not in fluid communication between the space 11 and the liquid storage tank 50, and the operation of the pump 52 is stopped. In that, the liquid surface 21 of the first dielectric liquid 20 is uncovered and exposed to the closed space 11 of the tank 10, and the first dielectric liquid 20 is cooperated with the condensing unit 13 to dissipate the heat generated from the working object 14 effectively. In other words, with the liquid surface 21 of the first dielectric liquid 20 selectively covered by the second dielectric liquid 40 in the immersion cooling system 1 of the present disclosure, it ensures that the volatilization and the loss of the first dielectric liquid 20 is avoided during the initial installation of the working object 14. The maintenance or replacement operation of the working object 14 immersed in the first dielectric liquid 20 is simplified. Moreover, the work time is decreased and the operation efficiency is improved.

Figure 3:
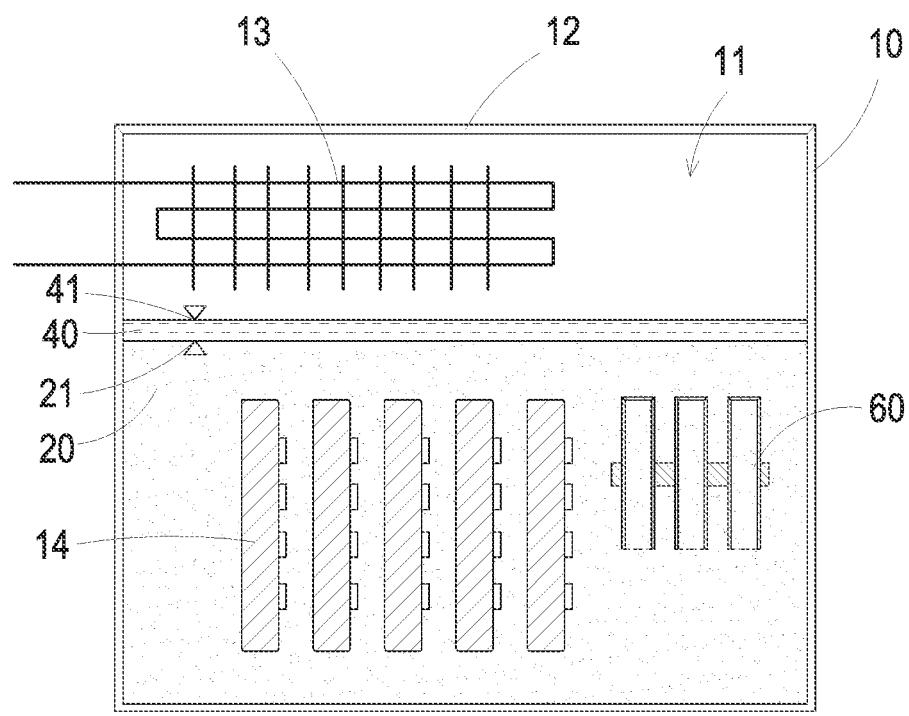
FIG. 3 is a schematic diagram illustrating an immersion cooling system having the first dielectric liquid, which is not exposed to the space free of being filled with the first dielectric liquid and the second dielectric liquid and covered by the second dielectric liquid, according to a second embodiment of the present disclosure.
Figure 4:
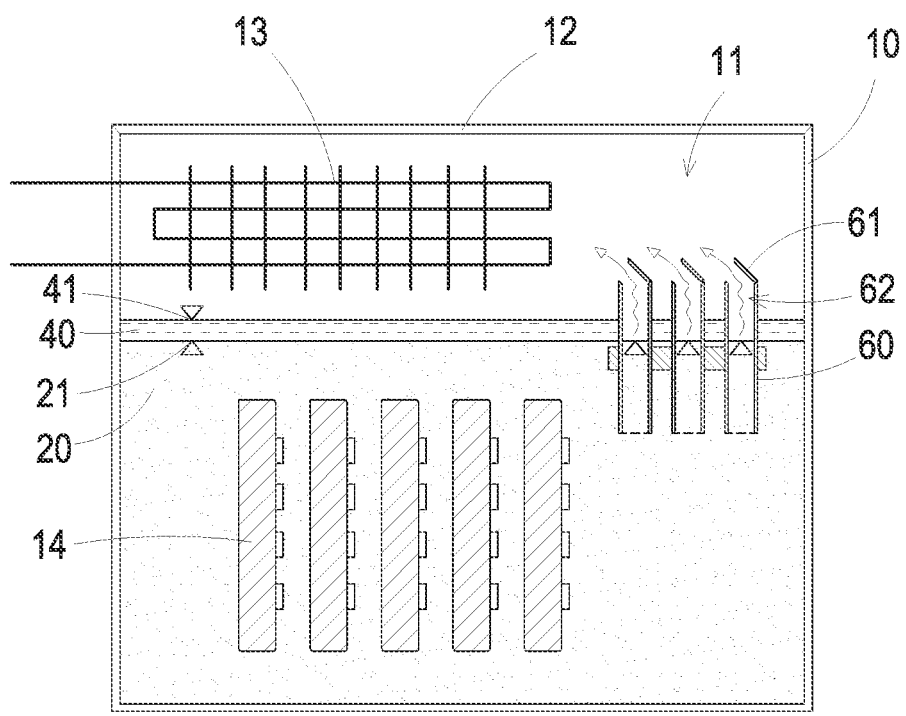
FIG. 4 is a schematic diagram illustrating the immersion cooling system having a part of the first dielectric liquid, which is exposed to the space free of being filled with the first dielectric liquid and the second dielectric liquid and uncovered through the second dielectric liquid, according to the second embodiment of the present disclosure.

FIG. 3 is a schematic diagram illustrating an immersion cooling system having the first dielectric liquid, which is not exposed to the space free of being filled with the first dielectric liquid and the second dielectric liquid and covered by the second dielectric liquid, according to a second embodiment of the present disclosure. FIG. 4 is a schematic diagram illustrating the immersion cooling system having a part of the first dielectric liquid, which is exposed to the space free of being filled with the first dielectric liquid and the second dielectric liquid and uncovered through the second dielectric liquid, according to the second embodiment of the present disclosure. In the embodiment, the immersion cooling system 1a is similar to the immersion cooling system 1 shown in FIGS. 1 to 2, and the same labels of the components represent the same components, structures and functions, not redundantly described herein. In the embodiment, the immersion cooling system 1a includes a tank 10, a first dielectric liquid 20, a second dielectric liquid 40 and a communication object 60. The tank 10 has a space 11. The first dielectric liquid 20 is accommodated within the space 11. The second dielectric liquid 40 covers a liquid surface 21 of the first dielectric liquid 20. The communication object 60 is accommodated within the space 11. Preferably but not exclusively, the communication object 60 is controlled by a control device (not shown) to move relative to the liquid surface 21 of the first dielectric liquid 20 and enable or disable a fluid communication function thereof. In an embodiment, the communication object 60 is immersed in the first dielectric liquid 20, and the liquid surface 21 of the first dielectric liquid 20 is covered by the second dielectric liquid 40, as shown in FIG. 3. In another embodiment, the communication object 60 is moved upwardly and partially passed through the liquid surface 41 of the second dielectric liquid 40, and a part of the liquid surface 21 of the first dielectric liquid 20 is uncovered through the second dielectric liquid 40, as shown in FIG. 4.

In the embodiment, the first dielectric liquid 20 is immiscible with the second dielectric liquid 40, the density $\rho_2$ of the second dielectric liquid 40 is less than the density $\rho_1$ of the first dielectric liquid 20, and the vapor pressure $P_2$ of the second dielectric liquid 40 is less than the vapor pressure $P_1$ of the first dielectric liquid 20. With the characteristics of the first dielectric liquid 20 and the second dielectric liquid 40, when the liquid surface 21 of the first dielectric liquid 20 is completely covered by the second dielectric liquid 40, the volatilization and the loss of the first dielectric liquid 20 is avoided. At this time, if the operator wants to maintain or replace the working object 14 immersed in the first dielectric liquid 20, the working object 14 can be directly taken out or replaced by the operator through the second dielectric liquid 40. There is no need to wait for the first dielectric liquid 20 to cool down before performing the operation. Thus, the operation time of maintaining or replacing the working object 14 is reduced. At the same time, it ensures that the first dielectric liquid 20 does not volatilize and lose during performing the operation. In other embodiment, the working object 14 is immersed in the first dielectric liquid 20 through the second dielectric liquid 40 in an initial installation. It is not redundantly described herein.

On the other hand, in the embodiment, the first dielectric liquid 20 is served as a heat-dissipation medium for the working object 14. The temperature of the first dielectric liquid 20 directly in contact with the working object 14 is gradually increased by absorbing the heat generated from the working object 14. In the embodiment, preferably but not exclusively, the communication object 60 includes a valve element 61. By moving the communication object 60 upwardly to partially pass through the liquid surface 41 of the second dielectric liquid 40, the valve element 61 is exposed to the space 11 free of being filled with the first dielectric liquid 20 and the second dielectric liquid 40, as shown in FIG. 4. When the fluid communication function of the valve element 61 is enabled and an access opening 62 of the communication object 60 is in fluid communication between the space 11 and the first dielectric liquid 20, a part of the liquid surface 21 of the first dielectric liquid 20 is exposed to the space 11 free of being filled with the first dielectric liquid 20 and the second dielectric liquid 40. Since a part of the liquid surface 21 of the first dielectric liquid 21 is uncovered through the second dielectric liquid 40 and exposed to the space 11, the heat generated from the working object 14 is effectively dissipated through the first dielectric liquid 20. In other words, with the communication object 60, the liquid surface 21 of the first dielectric liquid 20 is selectively covered or uncovered by the second dielectric liquid 40, it is helpful of simplifying the maintenance or replacement operation of the working objects 14 immersed in first dielectric liquid 20. Moreover, the work time is decreased and the operation efficiency is improved. When the maintenance or replacement operation has to be performed in the immersion cooling system 1a of the present disclosure, the valve element 61 of the communication object 60 is closed to disable the fluid communication function of the access opening 62. Then, the communication object 60 is immersed into the first dielectric liquid 20. In an embodiment, the communication object 60 is immersed into the first dielectric liquid 20. Then, the valve element 61 of the communication object 60 is closed to disable the fluid communication function of the access opening 62. In other embodiments, the manner and the sequence of enabling the fluid communication function of the access opening 62 of the communication object 60 are adjustable according to the practical requirements. Certainly, the manner of allowing a part of the liquid surface 21 of the first dielectric liquid 20 exposed or not exposed to the space 11, free of being filled with the first dielectric liquid 20 and the second dielectric liquid 40, is adjustable according to the practical requirements. The present disclosure is not limited thereto, and not redundantly described herein.

In summary, the present disclosure provides an immersion cooling system to avoid the loss of dielectric liquid when the working object immersed therein is maintained or replaced. By providing an access opening in fluid communication with a liquid surface of a first dielectric liquid, a second dielectric liquid can be introduced into the immersive cooling system directly and rapidly through the access opening, so as to improve the operating efficiency of the first dielectric liquid in the immersion cooling system. The first dielectric liquid is immiscible with the second dielectric liquid, the density of the second dielectric liquid is less than the density of the first dielectric liquid, and the vapor pressure of the second dielectric liquid is less than the vapor pressure of the first dielectric liquid. Thereby, the second dielectric liquid is introduced into the immersion cooling system to cover the first dielectric liquid before the immersion cooling system is opened for maintenance. It is helpful of avoiding the volatilization and the loss of the first dielectric liquid and ensuring the stability of the cooling performance of the entire immersion cooling system. Furthermore, when the immersion cooling system is closed to form a closed space for the cooling performance, the second dielectric liquid is removed from the liquid surface of the first dielectric liquid and introduced to the liquid storage tank for temporary storage, so that the heat generated by the working objects immersed in the immersion cooling system is dissipated through the first dielectric liquid effectively. In addition, the first dielectric liquid and the second dielectric liquid are used in the immersion cooling system. The first dielectric liquid is immiscible with the second dielectric liquid, the density of the second dielectric liquid is less than the density of the first dielectric liquid, and the vapor pressure of the second dielectric liquid is less than the vapor pressure of the first dielectric liquid. With the characteristics of the first dielectric liquid and the second dielectric liquid, the second dielectric liquid is selectively introduced to cover the liquid surface of the first dielectric liquid through the access opening, or a part of the liquid surface of the first dielectric liquid is selectively exposed to the space free of being filled with the first dielectric liquid and the second dielectric liquid through a communication object. Thereby, when the components of the immersion cooling system are installed, maintained or replaced in an open space, the second dielectric liquid is for example introduced from the liquid storage tank to cover the liquid surface of the first dielectric liquid, and it prevents the first dielectric liquid from volatilization and loss. When the immersion cooling system is closed to form a closed space for the cooling performance, at least a part of the liquid surface of the first dielectric liquid is uncovered through the second dielectric liquid and exposed to, the space free of being filled with the first dielectric liquid and the second dielectric liquid, so that the heat generated by the working objects immersed in the immersion cooling system is dissipated through the first dielectric liquid effectively. With the access opening and the communication object, the first surface of the first dielectric liquid is selectively covered by the second dielectric liquid. It ensures that the heat generated by the working objects immersed in the immersion cooling system is dissipated through the first dielectric liquid effectively, and the first dielectric liquid will not volatilize and lose during the initial placement of the working objects at the same time. The maintenance or replacement operation of the working object immersed in first dielectric liquid is simplified. Moreover, the work time is decreased and the operation efficiency is improved.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An immersion cooling system comprising:
a tank having a space;
a first dielectric liquid accommodated within the space, and the first dielectric liquid has a first liquid surface;
a second dielectric liquid covering the first liquid surface of the first dielectric liquid, and the second dielectric liquid has a second liquid surface; and
a communication object in direct contact with the first dielectric liquid, wherein when the communication object is moved to pass through the second liquid surface of the second dielectric liquid, a third liquid surface of the first dielectric liquid is formed, and the third liquid surface is uncovered and not contacted by the second dielectric liquid.

2. The immersion cooling system according to claim 1, wherein the first dielectric liquid is immiscible with the second dielectric liquid.

3. The immersion cooling system according to claim 1, wherein the density of the second dielectric liquid is less than the density of the first dielectric liquid.

4. The immersion cooling system according to claim 1, wherein the vapor pressure of the second dielectric liquid is less than the vapor pressure of the first dielectric liquid.

5. The immersion cooling system according to claim 1, further comprising a condensing unit arranged in the space above the liquid surface.

6. The immersion cooling system according to claim 1, further comprising a working object immersed in the first dielectric liquid, wherein the working object is in direct contact with the first dielectric liquid, and a heat generated by the working object dissipates through the first dielectric liquid.

7. An immersion cooling system comprising:
a tank having a first space, a second space, and an inner surface, wherein the inner surface defines the first space;
a first dielectric liquid accommodated within the first space, wherein the first dielectric liquid has a first liquid surface, the inner surface and the first liquid surface collaboratively define the second space, and the second space is above the first liquid surface;
a second dielectric liquid arranged above the first dielectric liquid and contacted with the first dielectric liquid; and
a communication object in direct contact with the first dielectric liquid, wherein when the communication object is opened, a second liquid surface of the first dielectric liquid is formed, wherein the second liquid surface is uncovered and not contacted by the second dielectric liquid, and the second liquid surface of the first dielectric liquid is exposed to the second space.

8. The immersion cooling system according to claim 7, wherein the first dielectric liquid is immiscible with the second dielectric liquid.

9. The immersion cooling system according to claim 7, wherein the density of the second dielectric liquid is less than the density of the first dielectric liquid.

10. The immersion cooling system according to claim 7, wherein the vapor pressure of the second dielectric liquid is less than the vapor pressure of the first dielectric liquid.

* * * * *